(12) United States Patent
Levant et al.

(10) Patent No.: US 11,389,793 B2
(45) Date of Patent: Jul. 19, 2022

(54) METHOD FOR PRODUCING A MICROFLUIDIC DEVICE

(71) Applicants: TOTAL SA, Courbevoie (FR); ECOLE NORMALE SUPERIEURE DE LYON, Lyons (FR); CENTRE NATIONAL DE LA RECHERCHE SCIENTIFIQUE—CNRS, Paris (FR); UNIVERSITE CLAUDE BERNARD LYON 1, Villeurbanne (FR)

(72) Inventors: Michael Levant, Lyons (FR); Denis Bartolo, Lyons (FR); Stéphane Parola, Jonage (FR); Denis Chateau, Caluire (FR)

(73) Assignees: TOTAL SA, Courbevoie (FR); ECOLE NORMALE SUPERIEURE DE LYON, Lyons (FR); CENTRE NATIONAL DE LA RECHERCHE SCIENTIFIQUE-CNRS-, Paris (FR); UNIVERSITE CLAUDE BERNARD LYON 1, Villeurbanne (FR)

(*) Notice: Subject to any disclaimer, the term of this patent is extended or adjusted under 35 U.S.C. 154(b) by 165 days.

(21) Appl. No.: 16/640,763

(22) PCT Filed: Sep. 8, 2017

(86) PCT No.: PCT/IB2017/001220
§ 371 (c)(1),
(2) Date: Feb. 21, 2020

(87) PCT Pub. No.: WO2019/048900
PCT Pub. Date: Mar. 14, 2019

(65) Prior Publication Data
US 2020/0215539 A1     Jul. 9, 2020

(51) Int. Cl.
*B01L 3/00* (2006.01)
*B81C 99/00* (2010.01)
(Continued)

(52) U.S. Cl.
CPC .... *B01L 3/502707* (2013.01); *B81C 99/0085* (2013.01); *C03B 19/12* (2013.01);
(Continued)

(58) Field of Classification Search
CPC ............ B01L 3/502707; B01L 3/5027; B01L 2200/12; B81C 2201/00; B81C 2201/0147; C03B 19/12
See application file for complete search history.

(56) References Cited

U.S. PATENT DOCUMENTS

2006/0194306 A1* 8/2006 Herr ................. B82Y 10/00
                                                    435/287.2
2009/0162616 A1* 6/2009 Chmelka ............ B82Y 20/00
                                                    428/167
(Continued)

FOREIGN PATENT DOCUMENTS

FR     2 787 100     6/2000
FR     2 914 630     10/2008

OTHER PUBLICATIONS

Mikkelsen et al., "All-silica nanofluidic devices . . . with silicon stamp", Lab Chip Royal Society of Chemistry, 2012, 12, 262-267.
(Continued)

*Primary Examiner* — Brian J. Sines
(74) *Attorney, Agent, or Firm* — Clark & Brody LP

(57) ABSTRACT

The present invention relates to a method for producing a microfluidic device, in particular, a sol-gel method for producing a microfluidic device in hybrid silica glass. The invention also relates to a microfluidic device obtainable by the method as described above and to microfluidic device in
(Continued)

hybrid silica glass comprising at least one microchannel having a depth of at least 1 μm, preferably between 1 μm and 1 mm, and more preferably between 10 and 100 μm.

13 Claims, 11 Drawing Sheets

(51) Int. Cl.
*C03B 19/12* (2006.01)
*B01J 31/02* (2006.01)

(52) U.S. Cl.
CPC ........ *B01J 31/0205* (2013.01); *B01L 2200/12* (2013.01); *B01L 2300/12* (2013.01); *B81B 2201/058* (2013.01)

(56) References Cited

U.S. PATENT DOCUMENTS

| | | | |
|---|---|---|---|
| 2010/0177384 A1* | 7/2010 | Peroz | C03C 1/008 359/485.01 |
| 2013/0034702 A1 | 2/2013 | Bockmeyer et al. | |
| 2013/0240871 A1 | 9/2013 | Shimoda et al. | |

OTHER PUBLICATIONS

C. Peroz et al., "Glass nanostructures fabricated by soft thermal nanoimprint", J. Vac. Sci. Technol. B 25(4), Jul./Aug. 2007.

* cited by examiner

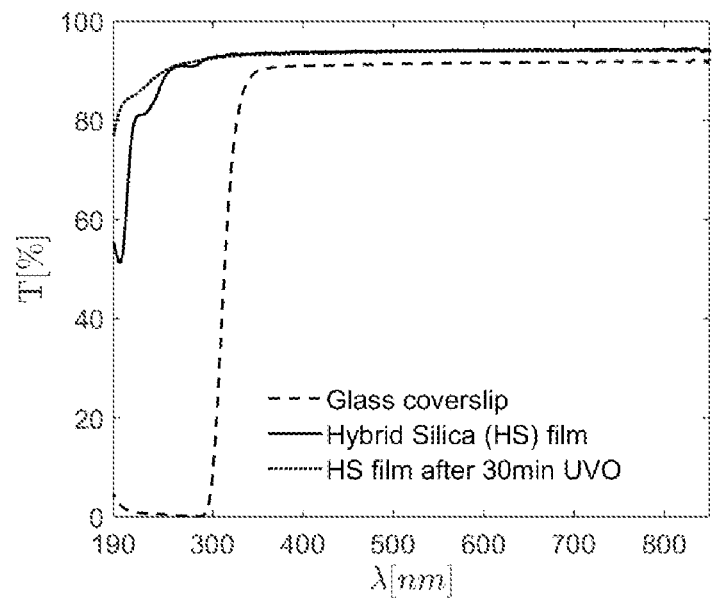
Fig. 6A.1
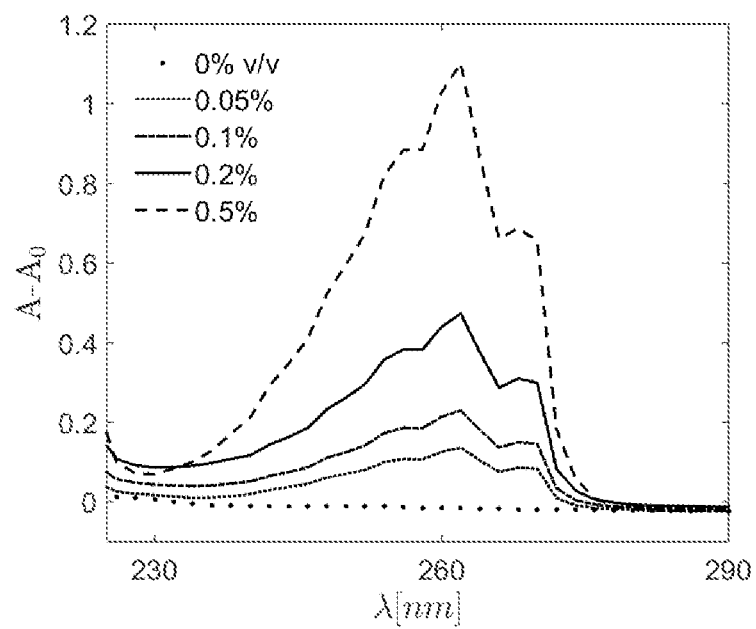
Fig. 6A.2

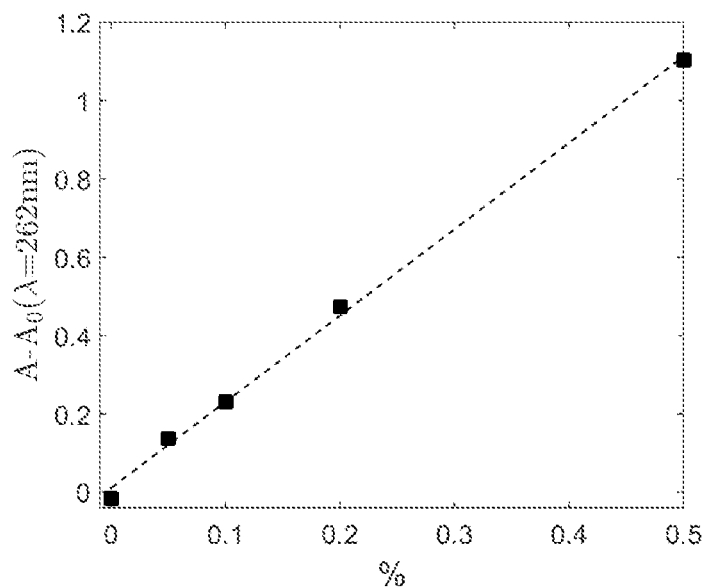
Fig. 6A.3
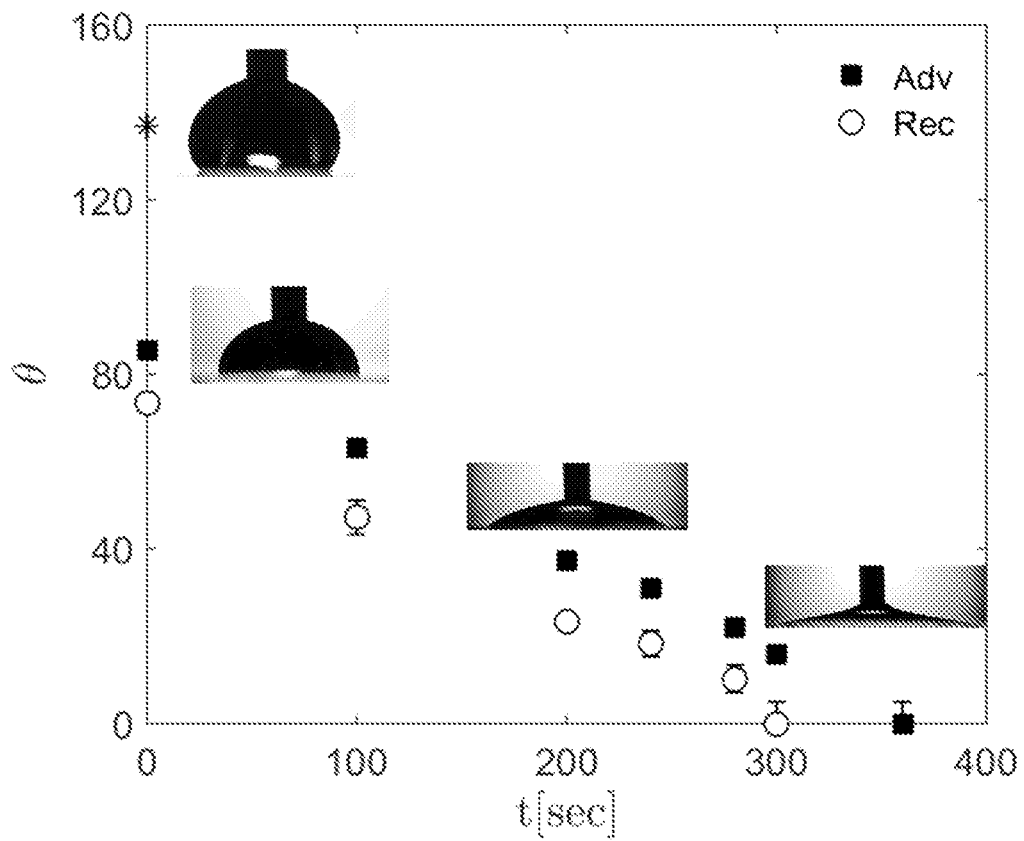
Fig. 6B.1

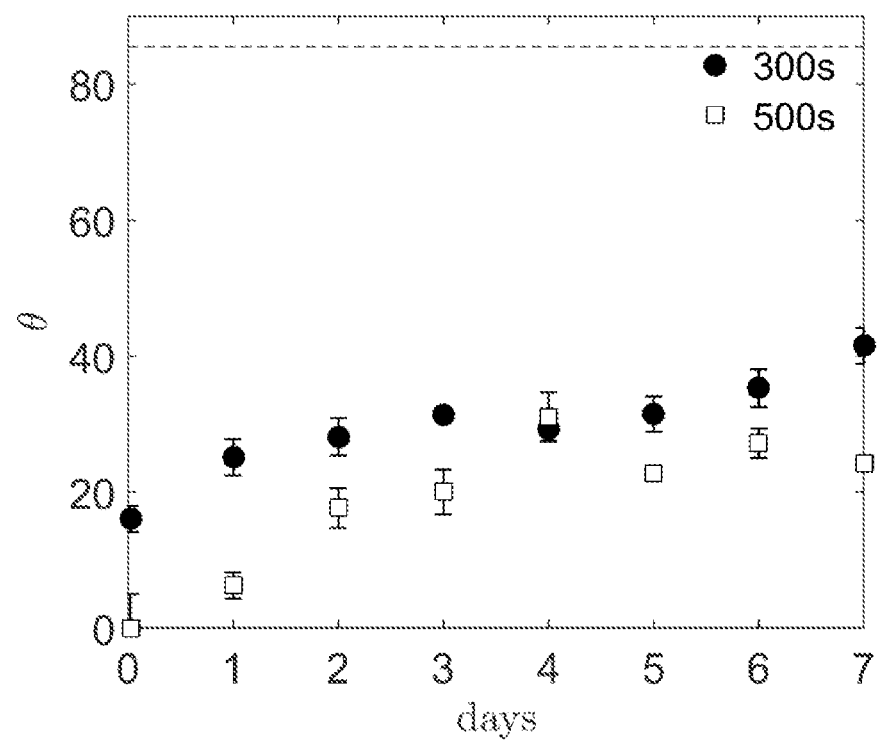
Fig. 6B.2
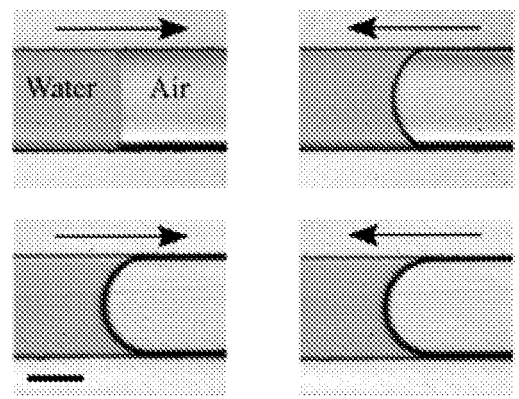
Fig. 6B.3

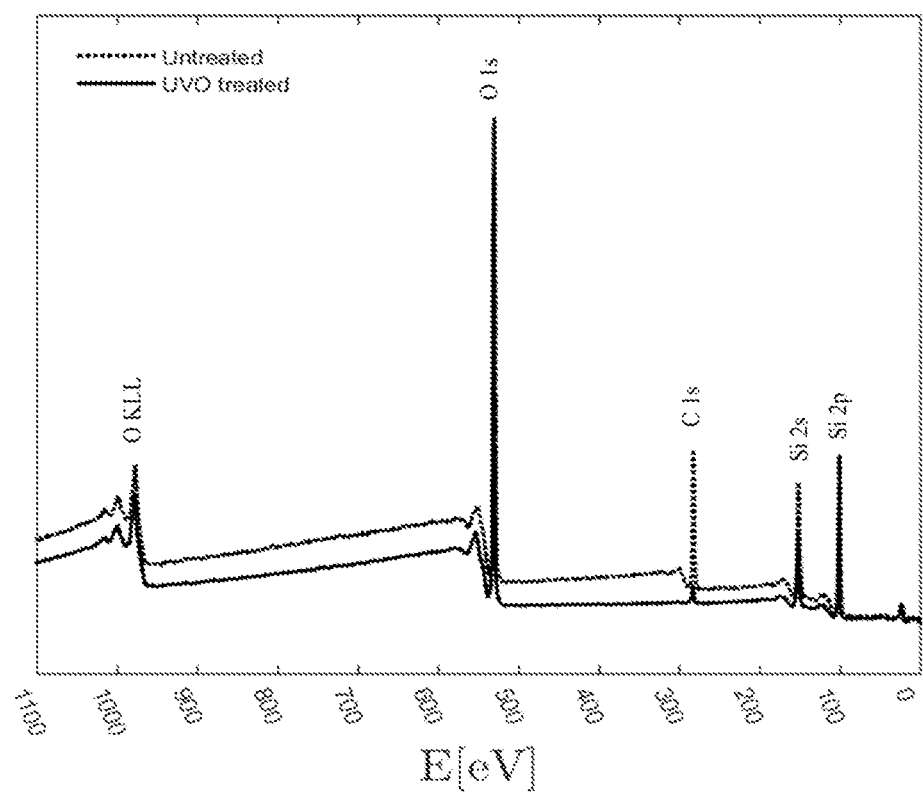
Fig. 6C.1
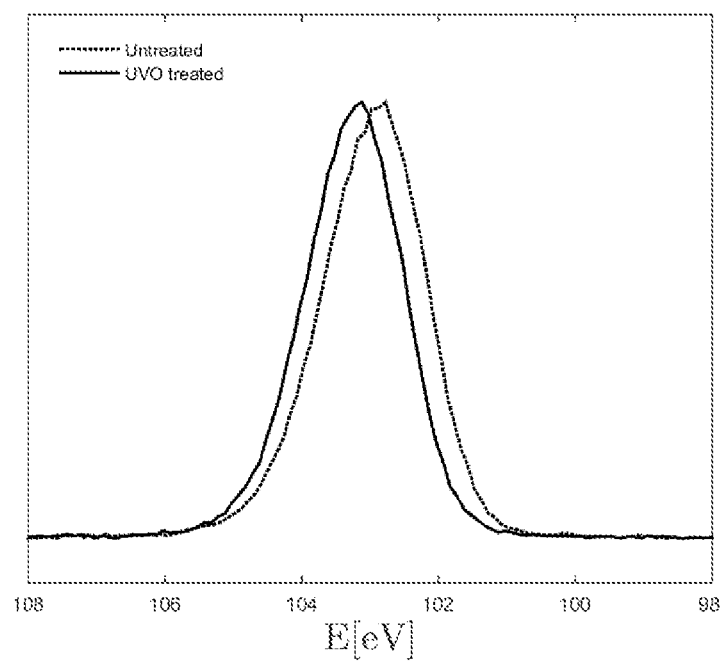
Fig. 6C.2

METHOD FOR PRODUCING A MICROFLUIDIC DEVICE

TECHNICAL FIELD

The present invention relates to a method for producing a microfluidic device, in particular, a sol-gel method for producing a microfluidic device in hybrid silica glass. The invention also relates to a microfluidic device obtainable by the method as described above and to microfluidic device in hybrid silica glass comprising at least one microchannel having a depth of at least 1 µm, preferably between 1 µm and 1 mm, and more preferably between 10 and 100 µm.

BACKGROUND ART

Microfluidics is a branch of the sciences that studies and attempts to make use of the mechanisms of the flow of fluids, liquids or gases through channels having dimensions ranging from about one millimeter to about one nanometer. This discipline has experienced remarkable growth during the last twenty years, and is used in many fields, such as chemistry, biotechnology, biology, fluid mechanics and energy application, like oil and gas recovery.

Many methods for manufacturing microfluidic devices have been described in the literature. The method that is most commonly used consists in manufacturing microfluidic devices from thermo- or photo-set polymers by replication using a mould. This method has the advantage of being simple, effective, rapid and inexpensive. One of the most commonly used thermo-set polymers is polydimethylsiloxane (PDMS).

However microfluidic devices often require to be optically transparent, operational at high pressures and in the presence of organic solvents, thereby suggesting silica glass as the material of choice. Microfluidic devices in silica glass have several advantages: the inertness of glass makes them chemically resistant, they have good mechanical properties, and they are transparent. A particular case of interest is enhanced oil recovery applications where using silica-glass micromodels is advantageous due to the abundance of silica in a significant portion of already discovered oil reservoirs worldwide.

Yet, the conventional methods to achieve glass patterning rely on etching technologies which are expensive, time consuming, involve elaborate and hazardous chemistry and finally offer limited patterning performance.

Promising results have been obtained for nanofluidic devices using silicon-alkoxides sol-gel methods, a soft-chemistry route allowing preparation of hybrid silica. However, despite the promising outline, the use of silicon-alkoxides sol-gel for microfluidics has actually been limited to submicron scales. As a matter of fact, the large amount of solvent, which makes the method ideal for spin coating to submicron layers, makes it, at the same time, incompatible with imprinting micro and milli-scale structures.

In this context, one of the aims of the invention is to provide a method for producing micron scale or mm scale patterns of a micro- and millifluidic pre-device.

Another essential aim is to provide a method for sealing these micron scale or mm scale patterns of a micro- and millifluidic pre-device in order to make micro- and millifluidic devices.

Another essential aim is to provide a method for producing micron scale or mm scale micro- and millifluidic devices.

Another essential aim of the present invention is to provide a method for producing monolithic micro and millifluidic devices that are transparent, can stand high pressure and the presence of organic solvent.

It would also be useful to provide a method for producing micron scale or mm scale micro- and millifluidic devices that is fast, cheap and easy to implement.

SUMMARY OF THE INVENTION

A first aspect of the present disclosure relates to a sol-gel method for producing a microfluidic device with a given pattern comprising the following steps:
a) implementing or preparing a sol A having a condensation ratio greater than or equal to 75%, preferably between 75 and 90%,
  i. the preparation of said sol A comprising:
    hydrolysis of at least one alkoxysilane of formula (I)

$$R_nSi(OR')_{4-n} \qquad (I)$$

wherein n is 1, 2 or 3, preferably 1 or 2;
R is a hydrocarbyl radical having 1-12 carbon atoms;
R' is a $C_1$-$C_6$ alkyl group;
using at least one aqueous solution of at least one water soluble organic acid catalyst,
condensation of the so-obtained hydrolysate;
  ii. at least partially removing one or more side product of the hydrolysis reaction;
  iii. using an organic solvent to collect the condensate obtained in i.;
b) optionally, evaporating an excess of solvent of said sol A;
c) patterning a volume of said sol A, preferably with flexible stamps;
d) curing the pattern of sol A issued from step c) to get at least one microfluidic gel pattern;
e) sealing at least one face of the microfluidic gel pattern with at least an element.

The use of a specific sol A prepared from alkoxysilanes makes it possible to have a method which is easy to implement starting from readily available starting materials. This method is therefore particularly suitable for fast prototyping of microfluidic devices. Moreover, it also makes it possible to obtain microfluidic devices having microchannels of which the depth ranges from 1 nm to 1 mm, or from 100 nm to 1 mm, or from 10 to 100 µm.

In a second aspect, the present disclosure relates to a microfluidic device obtainable by the method as described above.

Another aspect of the present disclosure relates to a microfluidic device in hybrid silica glass comprising at least one microchannel having a width and/or a depth of at least 1 µm, preferably between 1 µm and 1 mm, and more preferably between 10 and 100 µm.

BRIEF DESCRIPTION OF THE FIGURES

FIG. 2A represents an AFM scan of a lattice of square wells according to example 2a.

FIG. 6A.1 represents the UV-Vis spectrum of a glass coverslip, a hybrid silica glass film and a hybrid silica glass film treated by UVO according to the examples.

FIG. 6A.2 represents the UV-Vis measurements carried out in a helle shaw cell made of hybrid silica according to examples to detect toluene concentration in toluene/decane mixtures.

FIG. 6A.3 represents the linear correlation between the concentration of toluene and the absorbance at 262 nm according to examples.

FIG. 6B.1 represents the change of the contact angle in function of the UVO treatment, Adv represents the advancing contact angle and Rec represents the receding contact angle.

FIG. 6B.2—represents the contact angle variation over time (ageing) according to the examples.

FIG. 6B.3—represents the advancing (left) and receding (right) water menisci inside a straight rectangular channel with L×W×H=25×0.2×0.025 mm before (top) and after (bottom) in situ UVO treatment according to the examples. Arrows indicate the direction of the flow. Scale bar 100 µm.

FIG. 6C.1 represents the XPS spectrum of a hybrid silica glass film and a hybrid silica glass film treated by UVO according to the examples.

FIG. 6C.2 represents the energy shift of the Si2p peak from T to Q due to UVO treatment according to the examples.

DETAILED DESCRIPTION

Figure 1A:
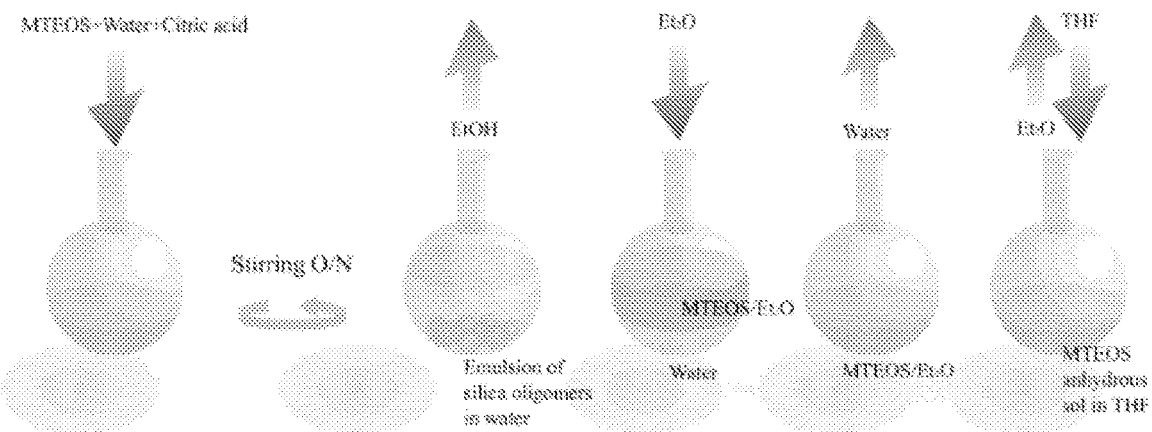
FIG. 1A represents an example of the synthesis of sol A using MTEOS as described in the examples.

The expression "microfluidic device" is understood in the present disclosure to mean a device comprising at least one microchannel in which a fluid, and in particular a liquid, may flow. A microchannel is a channel at least one of the dimensions of which, typically its depths and/or width, ranges from about one nanometer to about to one millimeter, typically between 1 nm and 1 mm, in size. The width and length refer to x-y dimensions (abscissa and ordinate) and depth (or height) to z-dimension (applicate). The microfluidic device may furthermore comprise one or more reservoirs, one or more reaction chambers, one or more mixing chambers and one or more separation zones. The microfluidic device typically has a base, walls defining the different areas like channels, or reservoirs, and a ceiling which is the element sealed on the face (open face), opposite to the base of the cured microfluidic gel pattern from step (d).

The cured microfluidic gel pattern from step (d) of the method according to the invention, is qualified herein, by convention as a "microfluidic pre-device". Said microfluidic pre-device typically has a base, walls extending from the base and defining the different areas like channels, or reservoirs, but no ceiling. The terms "base" and "ceiling" refers arbitrarily to a bottom and a top for the pre-device and the device. Naturally, such a frame of reference is reversible.

Actually, in a particular embodiment as represented on enclosed figures IB, the base corresponds to the side of the pre-device faced to the flat stamp. This latter is up on FIG. 1B but could also be down.

As used herein, the expression "monolithic microfluidic device" refers e.g. to a microfluidic device wherein the base, the walls and the ceiling are made of the same material.

All of the viscosities of which it is a question in this disclosure correspond to a magnitude of dynamic viscosity at 25° C. referred to as "Newtonian", i.e. the dynamic viscosity that is measured with an Anton Paar 302MCR302 rheometer.

The expression "sol-gel method" is understood in the present disclosure to mean a process through which a network is formed from solution by a progressive change of liquid precursor(s) into a sol (colloidal system) and then into a gel (non-fluid colloidal network or polymer network that is expanded throughout its whole volume by a fluid).

As used herein, the terms "hybrid silica glass" refer to a solid state material obtained by hydrolysis-condensation of at least one alkoxysilane containing at least one non-hydrolysable organic side chain.

As used herein, the term "$C_1$-$C_n$ alkyl" refers to a linear, branched or cyclic alkyl functional group having 1 to n carbon atoms. Suitable alkyl groups include methyl, ethyl, n-propyl, i-propyl, n-butyl, i-butyl, s-butyl and t-butyl, pentyl and its isomers (e.g. n-pentyl, iso-pentyl), and hexyl and its isomers (e.g. n-hexyl, iso-hexyl).

The term "$C_6$-$C_{12}$ aryl group" refers to a polyunsaturated, aromatic hydrocarbyl group having a single aromatic ring (i.e. phenyl) or multiple aromatic rings fused together (e.g. naphtyl), containing 6 to 12 atoms; preferably 6 to 10, wherein at least one ring is aromatic. The aromatic ring may optionally include one to two additional rings (cycloalkyl, heterocyclyl or heteroaryl) fused thereto.

The term "$C_1$-$C_8$ alkenyl group" as used herein refers to a monovalent group derived from a $C_1$-$C_8$ inclusive straight or branched hydrocarbon moiety having at least one carbon-carbon double bond. Alkenyl groups include, for example, ethenyl (i.e., vinyl), propenyl, butenyl, 1-methyl-2-buten-1-yl, pentenyl, hexenyl, octenyl, and butadienyl.

The term "$C_1$-$C_8$ alkynyl group" as used herein refers to a monovalent group derived from a straight or branched $C_1$-$C_8$ hydrocarbon of a designed number of carbon atoms containing at least one carbon-carbon triple bond. Examples of "alkynyl" include ethynyl, 2-propynyl (propargyl), 1-propynyl, pentynyl, hexynyl, heptynyl, and allenyl groups, and the like.

Method for Producing Microfluidic Device

In a first aspect, the present disclosure relates to a sol-gel method for producing a microfluidic device with a given pattern comprising the following steps:
  a) implementing or preparing a sol A having a condensation ratio greater than or equal to 75%, preferably between 75 and 90%,
    i. the preparation of said sol A comprising:
       hydrolysis of at least one alkoxysilane of formula (I)

wherein n is 1, 2 or 3, preferably 1 or 2;
       R is a hydrocarbyl radical having 1-12 carbon atoms;
       R' is a $C_1$-$C_6$ alkyl group;
       using at least one aqueous solution of at least one water soluble organic acid catalyst,
       condensation of the so-obtained hydrolysate;
    ii. at least partially removing one or more side product of the hydrolysis reaction;
    iii. using an organic solvent to collect the condensate obtained in i.;
  b) optionally, evaporating an excess of solvent of said sol A;
  c) patterning a volume of said sol A, preferably with flexible stamps;
  d) curing the pattern of sol A issued from step c) to get at least one microfluidic gel pattern;
  e) sealing at least one face of the microfluidic gel pattern with at least an element.

According to an embodiment, the method for producing a microfluidic device with a given pattern comprises the following steps:
  a) implementing or preparing a sol A having a condensation ratio greater than or equal to 75%, preferably between 75 and 90%,
    i. the preparation of said sol A comprising:
       hydrolysis of at least one alkoxysilane of formula (I)

wherein n is 1, 2 or 3, preferably 1 or 2;
       R is a hydrocarbyl radical having 1-12 carbon atoms;
       R' is a $C_1$-$C_6$ alkyl group;
       using at least one aqueous solution of at least one water soluble organic acid catalyst chosen among carboxylic acids, preferably carboxylic acids having 1 ro 12 carbon atoms and 1 to 3 carboxylic acid functions, and more preferably citric acid,
       condensation of the so-obtained hydrolysate;
    ii. at least partially removing one or more side product of the hydrolysis reaction;
    iii. using an organic solvent to collect the condensate obtained in i. by:
       adding at least one organic solvent OS1 to the reaction mixture in order to produce a biphasic medium, and separating the aqueous phase from the organic phase containing the condensate and the organic solvent OS1;
  b) optionally, evaporating an excess of solvent of sol A;
  c) patterning a volume of sol A, said sol A having a viscosity ≥1 Pa·s$^{-1}$, preferably between 1 and 10 Pa·s$^{-1}$, the patterning being performed with flexible stamps, preferably elastomer stamps;
  d) curing the pattern of sol A issued from step c), to get at least one microfluidic gel pattern, preferably at a temperature ranging from 15° C. to 150° C., preferably from 20° C. to 120° C.;
  e) sealing at least one face of the microfluidic gel pattern with an element coated with sol A, said sol A having a viscosity from 0.5 to 100 mPa·s$^{-1}$.

Step a)

The first step of the method is the implementation or the preparation of a sol A. This sol A is an organosilicon sol. The alkoxygroup(s) of the alkoxysilane of formula (I) are partially or totally hydrolyzed towards silanol groups (Si—OH) using an acid catalyst. These silanols then react with each other through a condensation reaction, (O—Si—O) bonds are formed and water is released. These reactions are performed in an aqueous solution, preferably in water. Sol A has a condensation ratio greater than or equal to 65%, preferably greater than or equal to 75%, preferably between 70 and 95%, and more preferably between 75 and 90%. This sol has a high condensation ratio, without gelation. The condensation ratio can be determined by $^{29}$Si-NMR: the condensation ratio Tc is defined by the following formula Tc=[0.5(area $T^1$)+1(area $T^2$)+1.5(area $T^3$)]/1.5; the area $T^n$ being the area under the peak $T^n$ on the $^{29}$Si-NMR spectrum. The superscript 'n' in '$T^n$' represents the number of bridging oxygen (OSi) surrounding the silicon atom.

The alkoxysilane has the following formula (I):

wherein n is 1, 2 or 3, preferably 1 or 2;
R is a hydrocarbyl radical having 1-12 carbon atoms;
R' is a $C_1$-$C_6$ alkyl group;

When n is 3, the method also comprises at least one alkoxysilane of formula (I) wherein n is 1 or 2. Advantageously, the alkoxysilanes of formula (I) wherein n is 3 represents less than or equal to 5% by weight of the total weight of the alkoxysilanes of formula (I), preferably less than or equal to 2% by weight.

The R groups can be identical or different. The hydrocarbyl radical having 1-12 carbon atoms can be chosen from the group consisting of $C_1$-$C_8$ alkyl groups, $C_1$-$C_8$ alkenyl groups, $C_1$-$C_8$ alkynyl groups and $C_6$-$C_{12}$ aryl groups, more preferably chosen from the group consisting of a methyl, ethyl and vinyl radical.

The R' groups can be identical or different, preferably, they are identical. The $C_1$-$C_6$ alkyl group is preferably a methyl or an ethyl group.

In a specific embodiment of the method according to the invention, the alkoxysilane of formula (I) is selected from the group consisting of TMOS (tetramethyl orthosilicate), TEOS (tetraethyl orthosilicate), MTEOS (methyltriethoxysilane), MTMOS (methyltrimethoxysilane), ETEOS (ethyltriethoxysilane), ETMOS (ethyltrimethoxysilane), VTEOS (vinyltriethoxysilane), VTMOS (vinyltrimethoxysilane) and mixtures thereof. Advantageously, the alkoxysilane of formula (I) is selected from the group consisting of TEOS, MTEOS and mixtures thereof.

The hydrolysis and/or condensation reaction(s) is(are) catalyzed by at least one water soluble organic acid catalyst. As used herein, the terms "water soluble" are intended to mean e.g. soluble in water at 20° C. at a concentration greater than or equal to 30 g/L, preferably greater than or equal to 100 g/L.

According to a preferred embodiment, the organic acid catalyst is chosen among carboxylic acids, preferably carboxylic acids having 1 to 12 carbon atoms and 1 to 3 carboxylic acid functions, and more preferably citric acid.

According to an embodiment, in step i., the molar ratio of the water to alkoxysilanes is ≥6, preferably ≥10.

Step ii. can be performed by evaporating one or more side product of the reaction. Generally, the side product of the reaction is the alcohol obtained from the hydrolysis of the alkoxysilanes.

In step iii., at least one organic solvent is used to collect the condensate. This step can be performed by:
  adding at least one organic solvent OS1 to the reaction mixture in order to produce a biphasic medium, and
  separating the aqueous phase from the organic phase containing the condensate and the organic solvent OS1.

According to a preferred embodiment, the solvent OS1 is chosen from solvents that are poorly miscible with water, have a low boiling point and are compatible with the sol-gel network. OS1 can be chosen from ethers, preferably, from diethylether, MTBE, methyl THF, THF and mixtures thereof.

After separation of the aqueous phase from the organic phase containing the condensate and the organic solvent OS1, it can be advantageous to replace at least partially the organic solvent OS1 by another solvent organic solvent OS2. For example, if OS1 is an ether like diethyl ether, it might be better to replace it at least partially with one organic solvent OS2, for instance another ether like THF, which is less volatile, and therefore better for long term storage. The solvent OS2 can be chosen from ethers, ketones, alcohols and mixtures thereof. Preferably, OS2 is chosen from MTBE, methyl THF, THF, dioxane, acetone, butanone, $C_1$-$C_4$ alcohols and mixtures thereof.

The organic phase containing the condensate and the organic solvent OS1 and/or OS2 is the sol A.

The organic solvents OS1 and OS2 are chosen among the organic solvents commonly used in organic chemistry.

Sol A can have a viscosity from 0.5 mPa·s$^{-1}$ to 10 Pa·s$^{-1}$

One advantage of the present method as opposed to prior art methods is the use of this water soluble organic acid catalyst which enables the control of the condensation ratio. When step iii. is performed and an organic solvent is used to collect the condensate, the water phase is discarded. As the organic acid catalyst used is highly soluble in water, the catalyst is also discarded with the water phase. There is therefore no catalyst anymore in the organic phase comprising the condensate to catalyze the reaction and a stable sol A with high condensation ratio at room temperature is obtained without gelation. It is therefore possible to "switch off" the condensation by discarding the water phase containing the organic acid catalyst. The sol A is very stable and can be preserved for several months, and even years, at low temperatures, e.g. −20° C.

Consequently, it is not necessary to prepare sol A right before implementing the method, it is possible to use a sol A which has already been prepared and stocked.

Step b)

Optionally, a step of evaporating of an excess of solvent of said sol A is carried. This can be performed by letting the sol A under air, at room temperature and ambient pressure, for some time e.g. for 1 or 2 hours, or under reduced pressure for some time e.g. for 0.5-1 hour, or under ambient pressure and under heating, e.g. to 45° C., for some time, e.g. for 10-20 minutes.

This step enables to have a sol A of a desired viscosity, for example, a viscosity >1 Pa·s.

Step c)

This step consists in patterning a volume of said sol A. The patterning can be done using the standards methods from the technology known as "soft imprint technology". Advantageously, it is performed using flexible stamps, preferably elastomeric, and more preferably stamps in polydimethylsiloxane (PDMS).

In general, a volume of sol A is deposited on the surface of a stamp, which can be patterned or flat, and another stamp, which can be patterned or flat, is put on top.

The specific sol A enables the use of multiscale stamp(s) for simultaneous patterning on different scales and/or patterning of inclined surfaces. Advantageously, the depth of the patterns on the stamp(s) can range from 1 nm to several mm, which is over two decades of length-scales. Typically, the depth of the patterns on the stamp(s) ranges from 100 nm to 1 mm, or from 10 to 500 µm, or from 10 to 100 µm. The width and/or length of the pattern can range from 100 nm to several cm, for example from 100 nm to 10 cm, or for example from 1 mm to 1 cm.

According to an embodiment, the sol A in this step has a viscosity ≥1 Pa·s$^{-1}$, preferably between 1 and 10 Pa·s$^{1}$.

Step d)

This step consists in curing the pattern of sol A. This step therefore results in the formation of a gel.

Because of the high condensation ratio of sol A, very little amount of solvent is released during this gelation step, which results in little shrinkage of the overall structure. The final condensation ratio can be controlled by curing time/temperature.

The curing is performed at a temperature compatible with the stamps used. The curing can be performed at a temperature ranging from 15° C. to 150° C., preferably from 20° C. to 120° C. For example, the curing can be done for 18 hours at a temperature between 35 and 55° C. and then for 1 hour at a temperature between 110 and 120° C.

After curing, the stamps are removed, preferably at room temperature. A free gel of the complementary pattern is thus obtained, which is a microfluidic pre-device. Advantageously, the depth of the patterns on the pre-device can range from 1 nm to several mm, which is over two decades of length-scales. Typically, the depth of the patterns on the pre-device ranges from 100 nm to 1 mm, or from 10 to 500 m, or from 10 to 100 µm. The width and/or length of the pattern can range from 100 nm to several cm, for example from 100 nm to 10 cm, or for example from 1 mm to 1 cm. The total thickness of the pre-device can be up to a few centimeters, for example, it can range from 1 µm to 1 cm, or from 100 µm to 500 µm.

Step e)

This step consists in sealing at least one face of the microfluidic gel pattern, or pre-device, with at least an element. This is the last step of the method and results in the production of a microfluidic device.

Typically, after step d), the base and the walls of the microfluidic device are in place and step e) is the sealing of the walls, so that the microfluidic device has a base, walls defining at least one microfluidic channel, and a ceiling, which is the element it is referred to hereabove.

According to an embodiment of the method, the sealing is done using sol A, preferably an element coated with sol A. In this case, a curing step, which can be as described above, is also performed and a monolithic microfluidic device is obtained.

Preferably, sol A has a viscosity from 0.5 to 100 mPa·s$^{-1}$.

A volume of sol A can be spin-coated on an element, which is then put into contact with the gel pattern obtained in step d). Advantageously, the element comprises inlets/outlets holes necessary for the production of a microfluidic device. Preferably, the element is in a material which can make Si—O bond, like glass.

The thickness of the layer of sol A on the element can range from 0.5 µm to 10 µm. For example, the thickness can be around 2 µm.

Advantageously, the depth of the patterns on the obtained microfluidic device can range from 100 nm to 1 mm, which is over two decades of length-scales. Typically, the depth of the patterns on the microfluidic device range from 10 to 500 µm, or from 10 to 100 µm. The width and/or length of the pattern can range from 100 nm to several cm, for example from 100 nm to 10 cm, or for example from 1 mm to 1 cm.

According to an embodiment, the total thickness of the obtained microfluidic device can be up to a few centimeters, for example, it can range from 1 m to 1 mm, or from 100 µm to 500 µm.

Step f)

The method can further comprise an additional step f) of surface treatment. Advantageously, it is possible to reduce the organic content via in-situ treatment of the microfluidic device with UV-Ozone. It is also possible to perform a chemical functionalization treatment, like silanization treatment on the surface of the microfluidic device, for example with fluoro-chloro-silanes.

This step f) allows the control of the hydrophobicity/hydrophilicity of the surface of a microfluidic device.

In another of its aspects, the invention also pertains to a method for controlling the hydrophobicity/hydrophilicity of the surface of a microfluidic device issued from the method for producing as herein described. Said method can consist in an in-situ treatment with UV-Ozone.

The surface treatment can be performed to control the hydrophobicity/hydrophilicity of the surface, which can be measured via the contact angle. Consequently, it is possible to modify the surface properties of the microfluidic device according to the desired application.

Microfluidic Device

In a second aspect, the present disclosure relates to a microfluidic device obtainable by the method as described above.

Another aspect of the present disclosure relates to a microfluidic device, preferably monolithic, in hybrid silica glass comprising at least one microchannel having a depth of at least 1 µm, preferably between 1 µm and 1 mm, and more preferably between 10 and 100 µm. The width and/or length of the microchannel can range from 100 nm to several cm, for example from 100 nm to 10 cm, or for example from 1 mm to 1 cm. According to an embodiment, the total thickness of the microfluidic device can range from few 1 µm to several centimeters, preferably from 10 µm to 1 mm, or from 100 µm to 500 µm.

One advantage of the present microfluidic device is that it has interesting properties. The microfluidic device is mostly inorganic, can stand more than 6 bars of pressure, and has a Young modulus of around 3 GPa. Typically, the inorganic content of the microfluidic device made of hybrid silica glass is >75%.

Moreover, it is possible to adjust the contact angle depending of the surface treatment performed on the hybrid silica glass. Advantageously, the contact angle can vary from 0 to 140°. This enables to tune the surface properties of the microfluidic device depending on the application. The surface modification is constant over at least several days which is a sufficiently long period of time compared to experimental timescales.

The microfluidic device can be used in all sorts of applications, like oil recovery research, biology, biotechnology and chemistry. In particular, such device can be used to study the rheological properties of fluids. It can also be used for conducting high throughput and high content biological screening, or for growing microorganisms. The properties of the microfluidic device make it particularly suited for carrying reactions that take several hours or days, for example, experiments implying the growth of microorganisms. The microfluidic device can also be used as a microreactor.

The microfluidic device has also very good UV transparency, especially compared to conventional glass. For example, in a film having a thickness of approximately 100 µm, the transmission is ≥80% between 190 and 300 nm. It is therefore possible to detect molecules having absorption peaks in this area, while it is not possible to do it in microfluidic devices in conventional glass.

Another aspect of the present disclosure relates to a method for detecting UV active molecules in a liquid passing through a microfluidic channel of a microfluidic device according to the invention, said method comprising a step of measuring the absorption of the liquid passing through the microfluidic channel of the microfluidic device using a spectrophotometer. Preferably, the UV active molecules that are detected have at least one absorption peak between 190 and 300 nm.

Another aspect of the present disclosure relates to the use of the microfluidic device according to the invention for simulating an oil reservoir and studying the rheological properties of fluids.

EXAMPLES

Materials,

Methyltriethoxysilane (MTEOS) was purchased from ABCR (Ref. AB111242, 98%). Diethyl ether (99.5%) and citric acid monohydrate (99.5%) were purchased from Aldrich. Tetrahydrofuran (HPLC grade, inhibitor-free) was purchased from VWR. All the water used was MilliQ grade.

Imaging Methods:

Atomic force microscopy (AFM) measurements: AFM experiments were performed in a Multimode 8 system, with Nanoscope V controller (Bruker), operation mode-PeakForce QNM in air with a ScanAssyst Air HR cantilever (Bruker) characterized by a typical spring constant k=0.4 N/m and tip radius R=2 nm. AFM images of the grating and the hybrid silica replica (5×5 µm2) were recorded at 1.63 Hz, 1024 pixel/line, and force setpoint of 600 pN.

Confocal imaging: Arrays of cylindrical cavities 50 µm high with varying diameter varying from 10 to 100 µm were fabricated via soft lithography. Hybrid silica replicas of the cavities were filled with fluorescent glycerol/water solution, 50% w/w+0.001% fluorescein and imaged with Zeiss LSM710 confocal microscope through oil immersed ×40 objective. Images were processed in MATLab.

Scanning electron microscope (SEM): SEM images of non-conductive samples were taken in a Zeiss Supra 55VP microscope in VP mode.

Viscosity measurements: The viscosity (of the sols) was measured in Anton Paar 302MCR302 rheometer at room temperature. A cone-plate 60 mm geometry with a Rhodorsil 47s 100 silicon oil spread around the plate to slow down the uncontrolled evaporation was used. The measurements were carried out first at several shear rates from 10 to 200 s−1 with no dependence on shear rate and finalized with long measurements at 50 s−1.

General Procedure for the Synthesis of Hybrid Silica Glass Articles:

MTEOS hydrolysis (step a): In a 500 ml round bottom flask, MTEOS (100 ml) is hydrolyzed by an aqueous solution of citric acid (100 ml, 15 g/l of citric acid monohydrate).

The mixture is stirred vigorously (1000 rpm) for 20 minutes and at moderate speed (500 rpm) for 18 h at RT. The resulting sol is evaporated under vacuum to a final volume of about 100 ml. Then, 100 ml of water is added under stirring, resulting in phase separation and sedimentation of the hydrophobic viscous sol. The sol is then diluted in diethyl ether and the aqueous phase is disposed. The sol is washed three times with 20 ml of water, monitoring the pH of the extracted water, then diethyl ether is evaporated under vacuum and replaced by THF with a final solid residue for the prepared sol adjusted to 30-50%. The sol is filtered through a 1-2 µm glass fiber filter. The sol has a condensation ratio of about 82%. All quantities described above can be upscaled.

This step is represented in FIG. 1A.

Micropatterning (step b, c and d): Soft stamps were cast in PDMS (Sylgard 184, 1:10 crosslinking ratio) from molds fabricated via micromilling, soft lithography with photocurable SU-8 resin (GM 1070 from Gersteltec SARL), or from real life objects. Stamps were fully cured and degassed for >1 hr prior to patterning. About 2 g of MTEOS sol were evaporated in an aluminum mixing bowl under a chemical hood for about 1 hr (viscosity>1 Pa·s), then spread on the patterned PDMS stamp and closed with a flat PDMS at ambient pressure. After 0.5 hr at room temperature the stamps were dried overnight (>9 hrs) at 45 degrees in a ventilated oven, and the final cross-linking done at 80-120° C. for about 1 hr. The pre-evaporation time and the final curing time/temperature can be tuned depending on the hydrolysis/condensation time and the solid content. The stamps were removed at room temperature.

Figure 1B:
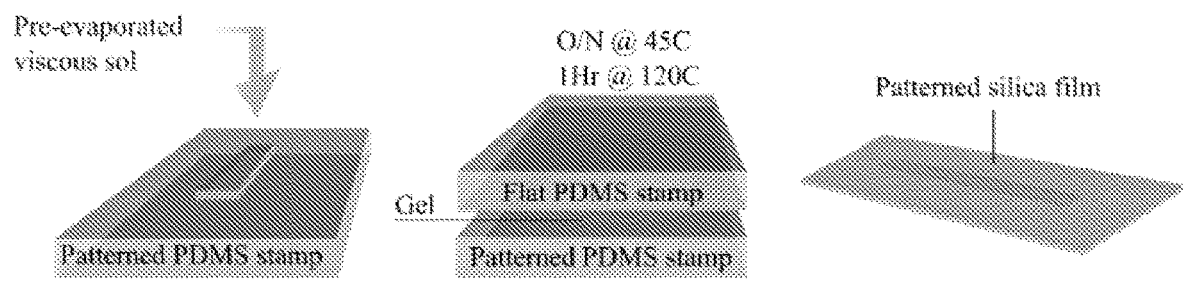
FIG. 1B represents an example of the patterning technique used in the examples.

This step is represented in FIG. 1B.

Sealing of the microfluidic device (step e): A droplet of fresh sol (viscosity ~10 mPa·s) was spread and spin-coated at 3000 rpm for 40 s with 400 rpm/min acceleration on a predrilled microscope glass slide containing the inlet/outlet holes, treated in plasma. The patterns were treated in plasma for 5 min then aligned with the inlet/outlet holes and placed on the fresh MTEOS surface while gently pressing on the pattern. The bonding was completed by overnight curing at 45° C. and 1 hr at 80° C. (similar results were obtained after about one week at room temperature).

Figure 1C:
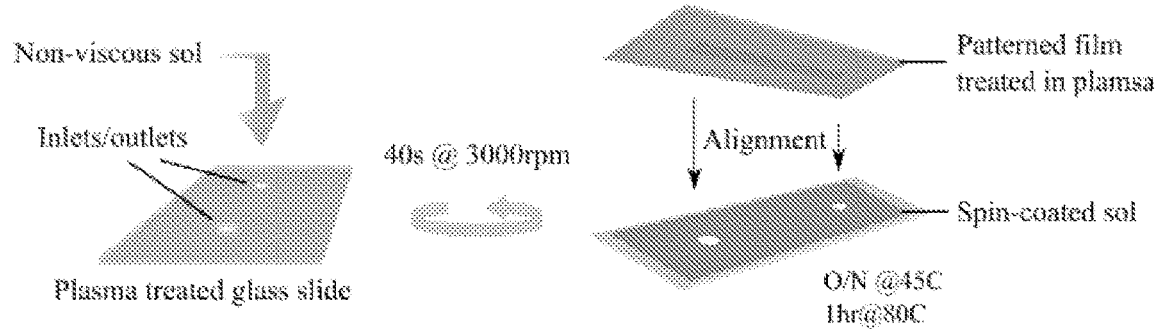
FIG. 1C represents an example of the sealing technique used in the examples.

This step is represented in FIG. 1C.

Example 1

Figure 1D:
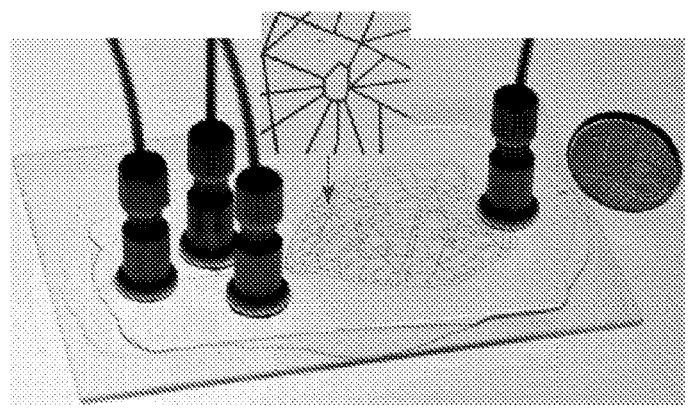
FIG. 1D represents a picture of a microfluidic device according to example 1.

A microfluidic device representing a road map of Paris was made using the general procedure. A picture of the obtained microfluidic device is shown in FIG. 1D.

This example shows that it is possible to produce a microfluidic device using the above method.

Figure 2A:
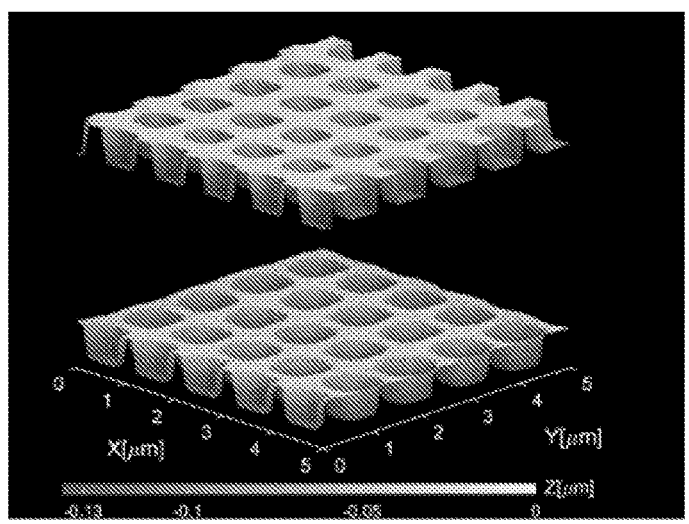
Figure 2B:
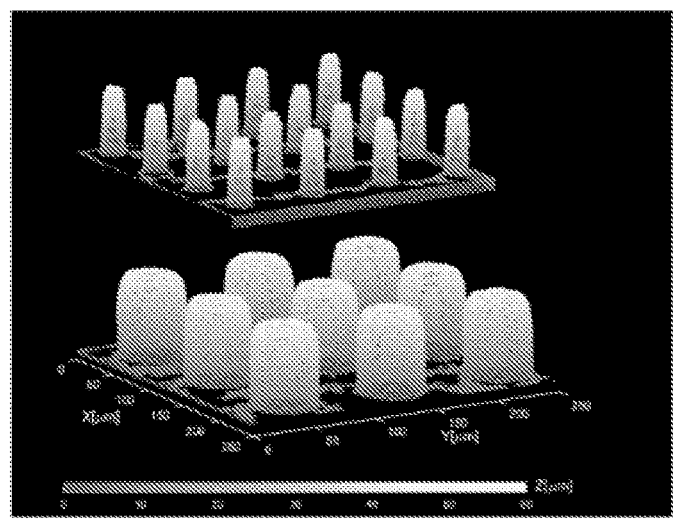
FIG. 2B represents a confocal image of cylindrical cavities according to example 2b.
Figure 2C:
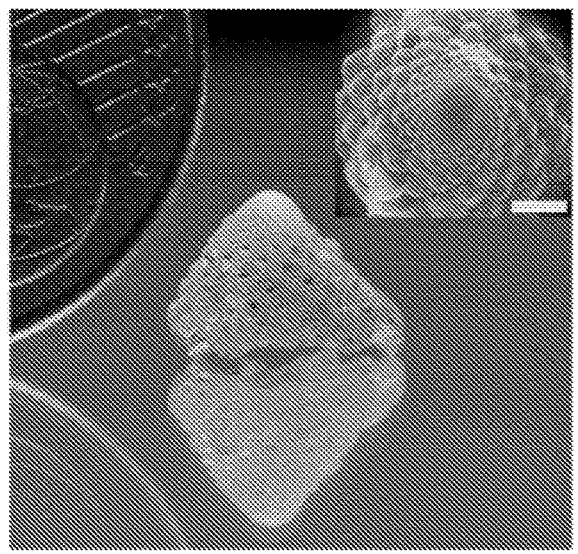
FIG. 2C represents a picture of a roman cauliflower according to example 2c. The inset represents a SEM picture of the replica (scale bar: 1 mm).

Example 2 a) A lattice of square well (period 1 µm, depth 100 nm) was made using the general procedure, without the sealing step. AFM scans of the lattice used as a model is shown on top of FIG. 2A and of the obtained replica in hybrid silica glass is shown on the bottom of FIG. 2A.

b) Cylindrical cavities (depth 50 µm) were made using the general procedure, without the sealing step. Confocal images of the hybrid silica glass cylindrical cavities filled with a fluorescent dye are shown in FIG. 2B (aspect ratio of 1/1: bottom and aspect ratio of 5/2: top).

c) A replica in hybrid silica glass of a roman cauliflower was made using the general procedure, without the sealing step. SEM picture of the obtained replica are shown in FIG. 2C.

Examples 2 a) and 2 b) show that it is possible to use the method to pattern at different scales, like nano- and microscale. Example 2 c) shows that it is possible to use the method to do multiscale patterning, which is not achievable by wet etching, for example.

Example 3

Figure 3A:
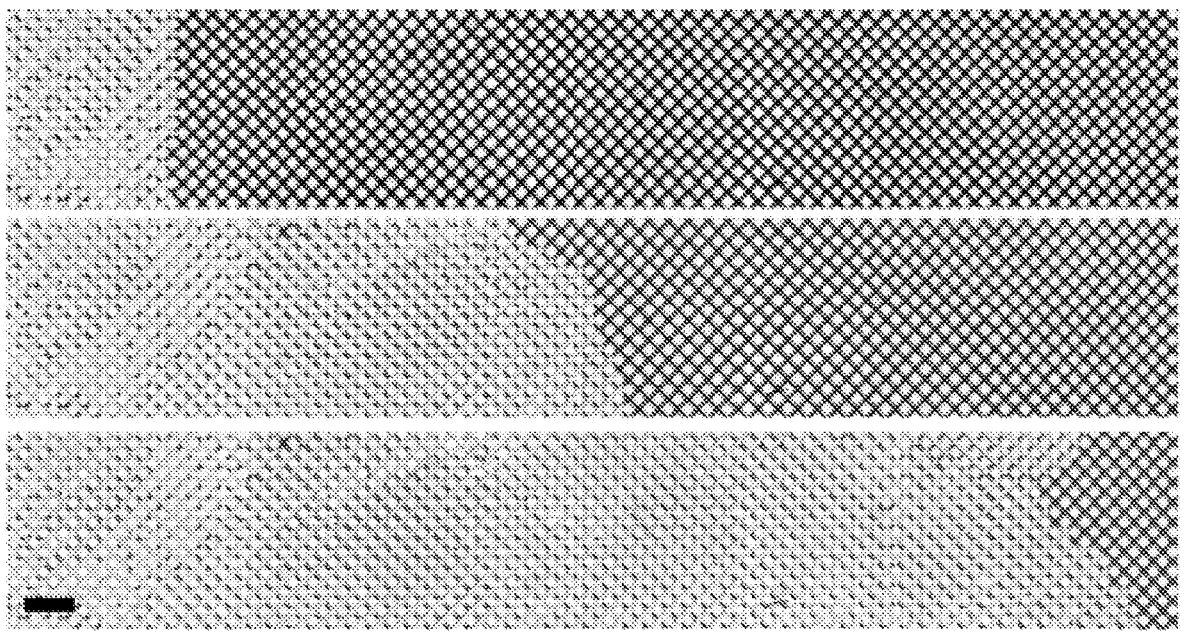
FIG. 3A represents pictures of the displacement of crude oil during water injection at different times in a microfluidic device, according to example 3.
Figure 3B:
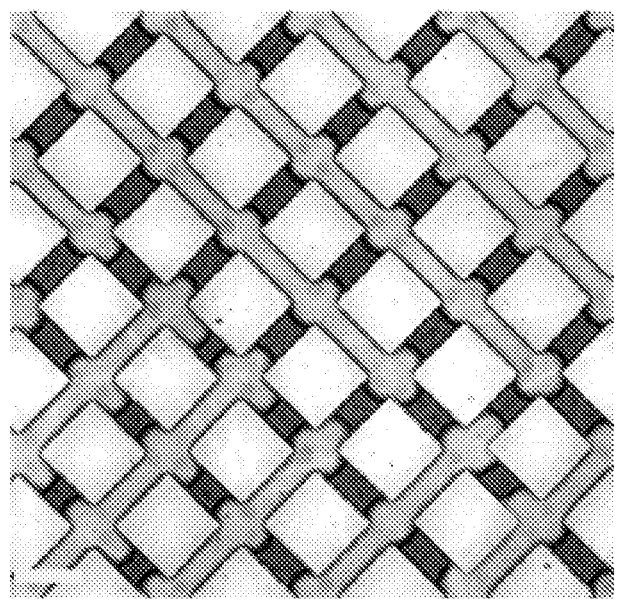
FIG. 3B represents a picture of the pores of the microfluidic device after 16 hours of water injection according to example 3 (scale bar: 200 µm).
Figure 3C:
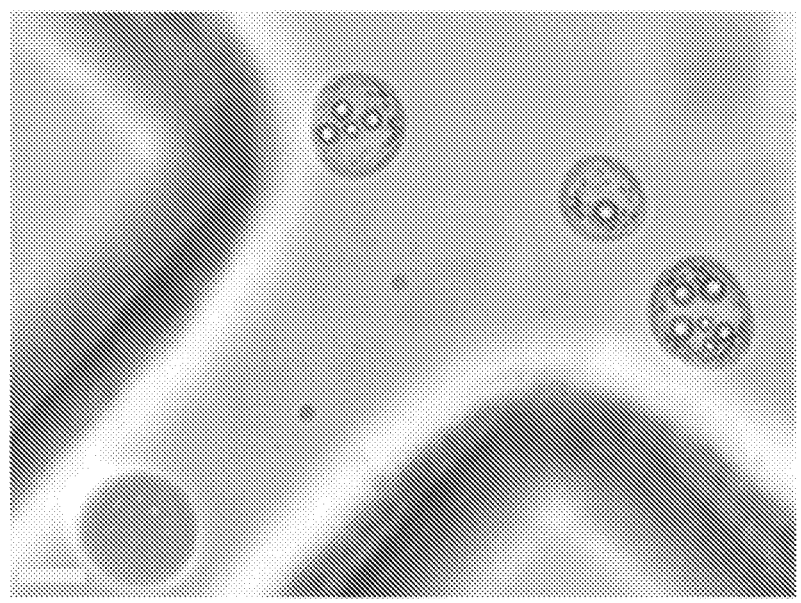
FIG. 3C represents a picture of the pores of the microfluidic device after 16 hours of water injection according to example 3 (scale bar: 20 µm).

A microfluidic device having straight rectangular channels of porous medium 80 µm deep and featuring an array of square pillars 200×200 µm was made using the general procedure. This microfluidic device was then filled with crude oil. Water is then injected and the displacement of the crude oil is then followed. Results are presented in FIGS. 3A, 3B and 3C. Some oil remains trapped inside the pores after more than 16 hrs water injection (FIG. 3B). A close look at the pore scale at enables detailed observations of the complex fluid-fluid-solid interfaces such as formation of double emulsions (FIG. 3C).

Example 4

A straight rectangular channel having the following dimensions L*W*H=41*1.1*0.1 mm was made using the general procedure.

Figure 4A:
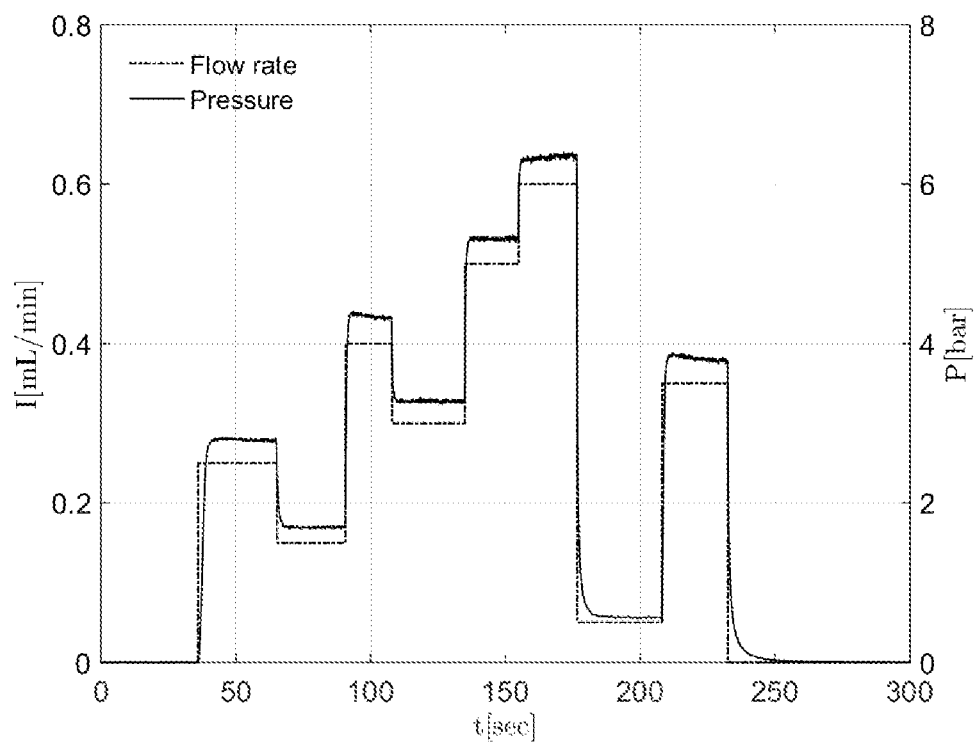
FIG. 4A represents the pressure response to applied flow rate according to the examples.
Figure 4B:
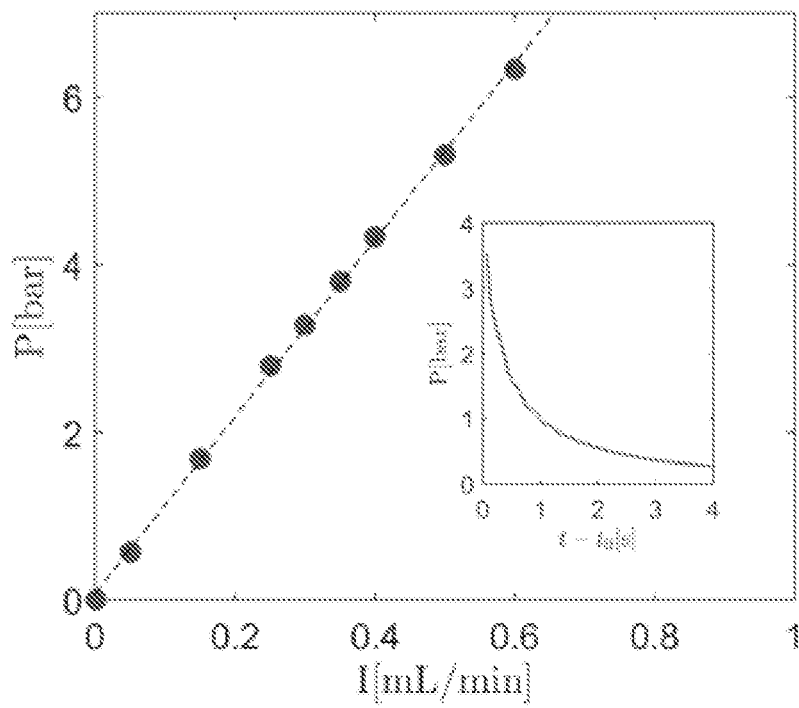
FIG. 4B represents the linear regression of the pressure response to applied flow rate according to the examples, the inset represents the response time of the pressure difference to a sudden stop of the flow rate.

Determination of Pressure Response to Flow Rate Variations:

The microfluidic device according to example 4 was used. Viscous 90% glycerol/water (v/v) solution was driven with a Nemesys syringe pump controlled through a Nemesys PC interface. The pressure reading from a Labsmith µP800 pressure sensor installed at the inlet of the channel, was recorded through Labsmith PC interface at 30 Hz. Data was analyzed in MATLab. The results are shown in FIGS. 4A and 4B. They show that a microfluidic device produced according to the above method can stand a pressure of at least 6 bars.

Figure 5A:
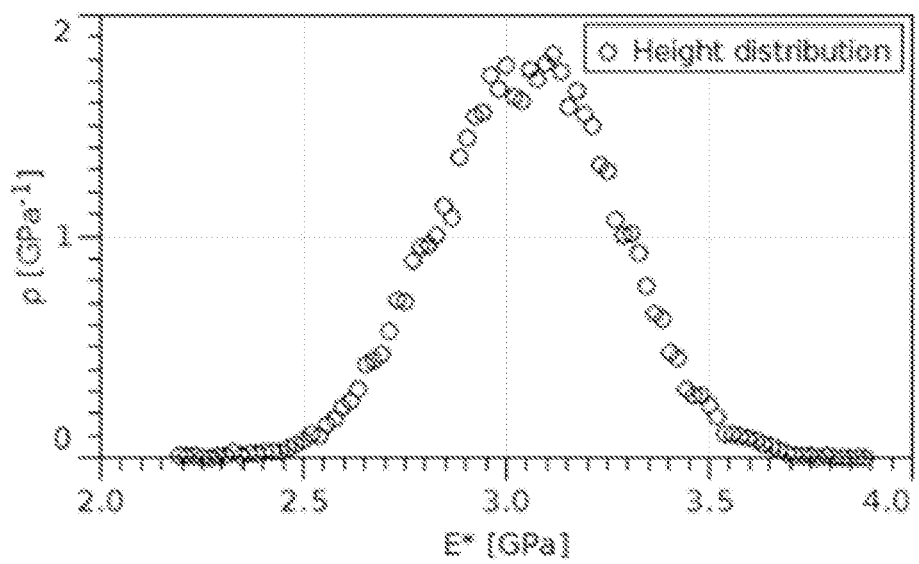
FIG. 5A represents the distribution of the young modulus of polystyrene according to the examples.
Figure 5B:
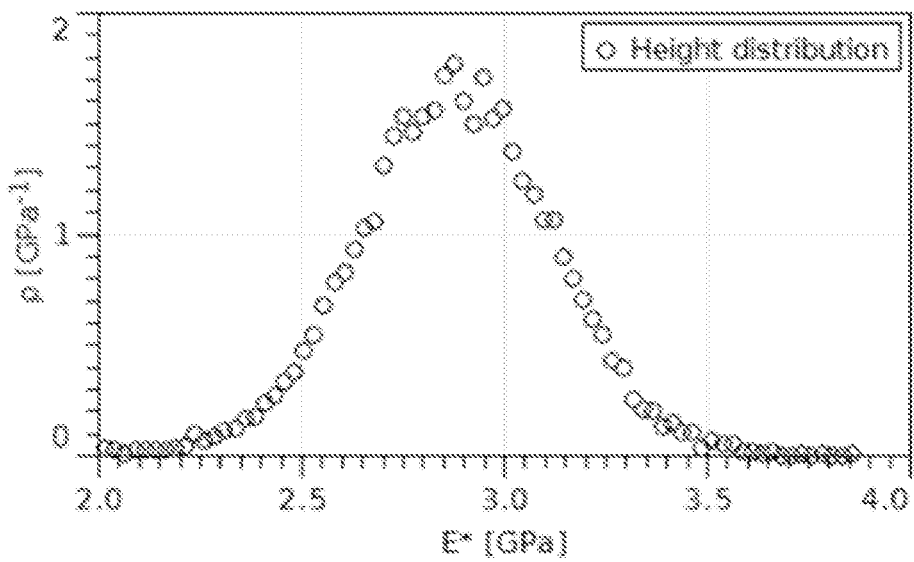
FIG. 5B represents the distribution of the young modulus of hybrid silica glass according to the examples.

Determination of the Young Modulus:

For estimation of the Young modulus of the hybrid silica glass a stiffer (RTESP-300 (Bruker), k=40 N/m and tip radius R=8 nm) cantilever was used. The deflection sensitivity (SD=36.42 nm/V) was estimated in a clean, hard sapphire sample (SAPPHIRE-12 M, Bruker). Then, a reference polystyrene sample (PS) of known properties (E=2.7 GPa, PSFILM-12M, Bruker) was measured and the tip radius was calibrated accordingly. Here an indentation d=1 nm was chosen. The results are shown in FIGS. 5A and 5B. They show that the young modulus of the hybrid silica glass is comparable to the one of polystyrene.

UV/Visible Spectrum

UV/visible spectra were recorded and compared to commercial glass coverslip of similar thickness (~100 µm). Results are shown on FIG. 6A.1, they show that both the hybrid silica film and the hybrid silica film treated by UVO have a high transparency at wavelength between 190 and 300 nm.

An analytic cell was assembled from two UV-transparent elements, preferably quartz, coated with a layer of non-viscous sol with 1 mm spacers in between and filled with solutions of toluene/n-decane in v/v concentrations from 0 (pure n-decane) to 0.5% and absorbtion spectra were measured.

FIG. 6A.2 shows the UV specta at different concentrations of toluene. This figure shows that it is possible to detect UV active molecules even at low concentrations. FIG. 6A.3 shows the linear correlation between the concentration of toluene and the absorbance at 262 nm. This figure shows that it is possible to quantify the amount of toluene in a microfluidic device according to the invention.

Influence of the UV-Ozone (UVO) Treatment (Step f):

Thin films prepared by spin-coating the sol on clean glass slides, were treated in a Jelight 42-220 UVO.

Variations of water contact angle as function of surface treatment (UVO) were measured. Images were recorded with Nikon D300s through a PC interface and analyzed in MATLab. The results are shown in FIG. 6B.1, they show that it is possible to modify the contact angle using UVO treatment. The surface modification is constant over at least several days which is a sufficiently long period of time compared to experimental timescales (cf. FIG. 6B.2). The surface modification in-situ relies on air circulation inside the channels which can be achieved by adding dedicated ozone accesses (cf. FIG. 6B.3).

X-ray photoelectron spectroscopy (XPS) measurements were carried out using a PHI Quantera SXM instrument (Physical Electronics, Chanhassen, USA) equipped with a 180° hemispherical electron energy analyzer and a monochromatized Al Kα (1486.6 eV) X-Ray source. The analysis spot had a diameter of 200 μm and the detection angle relative to the substrate surface was 450. The samples were analyzed with dual-beam charge neutralization and the atomic concentrations were determined using sensitivity factors provided by the manufacturer. Measurements were performed on two different areas to estimate standard deviation. We measured the spectra of two thin (~100 μm) films, ~1.5 cm2, where one of the films was exposed to UVO for 3 hours from each side.

The results are shown in FIG. 6C.1. We observe strong oxidation of the surface (increase of O1 s) and decrease in organic content (C1s) together with the shift in the Si2p peak from T to Q. Normalized Si2p peak is shown in FIG. 6C.2.

The atomic concentrations of C, O and Si were also determined. Each sample was measured in two different points. The results are shown in table 1.

TABLE 1

| XPS - atomic concentrations of the detected elements. | | | |
|---|---|---|---|
| % | C | O | Si |
| Sample 1 (Untreated) | 28.95 ± 0.20 | 44.55 ± 0.20 | 26.5 ± 0.20 |
| Sample 2 (3 hrs UVO) | 10.4 ± 4.2 | 64.3 ± 2.4 | 25.35 ± 1.76 |

Distribution of T and Q peaks corresponding to CH—Si—$(O)_3$ and Si—$(O)_4$ can be estimated from the C/Si ratio from table 1. The latter is ~1:1 for the untreated samples (slightly larger due to the presence of organic solvents, as seen in C-NMR), corresponding to 100% T-peaks, and at most 1:0.41 on the surface of the treated samples, corresponding to an upper bound of 41% T, 59% Q, due to more oxygen on the surface of the sample.

TABLE 2

| XPS analysis. Distribution of T and Q peaks corresponding to CH—Si—$(O)_3$ and Si—$(O)_4$. | | |
|---|---|---|
| % | T form | Q form |
| Sample 1 (Untreated) | 100 | 0 |
| Sample 2 (3 hrs UVO) | 41 | 59 |

Solid-state $^{29}$Si and $^{13}$C NMR (nuclear magnetic resonance) measurements were performed on a WB Avance III Bruker 500 MHz spectrometer at a magic angle spinning rate of 10 KHz. The delay time was 300 s with 280 scans for $^{29}$Si and 30 s with 2800 scans for $^{13}$C. To analyze the effect of the UVO on the bulk thin free standing film with large surface was prepared and grinded after extensive UVO treatment (~8 hrs on each side).

Figure 6D:
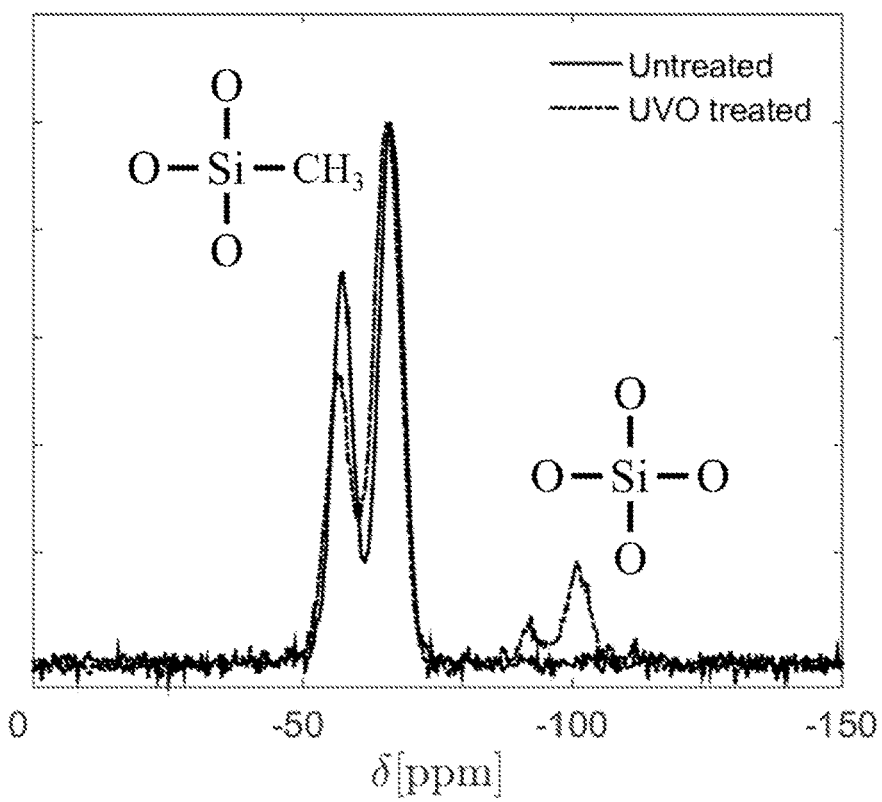
FIG. 6D represents a $^{29}$Si NMR spectrum of a hybrid silica glass film and a hybrid silica glass film treated by UVO according to the examples.

The $^{29}$Si NMR spectrum is shown in FIG. 6D. T2 and T3 peaks shows condensation ratio of about 86%. UVO treated sample shows lower T2/T3 peaks ratio indicating further condensation due to high temperature of the UVO of about 89% and appearance of new Q peak.

Figure 6E:
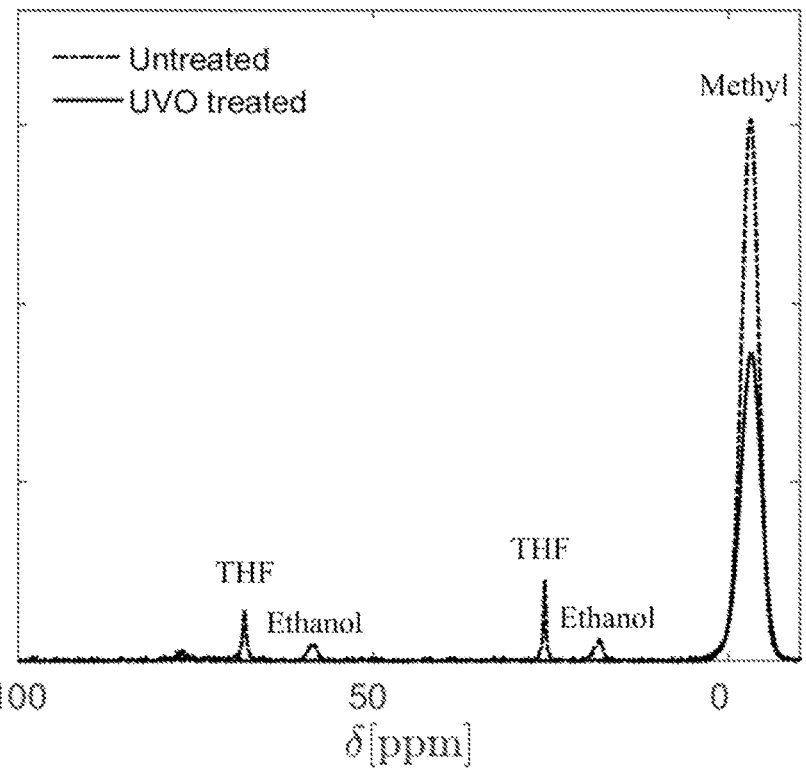
FIG. 6E represents a $^{13}$C NMR spectrum of a hybrid silica glass film and a hybrid silica glass film treated by UVO according to the examples.

The $^{13}$C NMR spectrum is shown in FIG. 6E. It shows a decrease of the content of organic groups.

The invention claimed is:
1. A sol-gel method for producing a microfluidic device with a given pattern comprising the following steps:
   a) implementing or preparing a sol A having a condensation ratio greater than or equal to 75%, preferably between 75 and 90%,
      i. the preparation of said sol A comprising:
         hydrolysis of at least one alkoxysilane of formula (I)

$$R_nSi(OR')_{4-n} \qquad (I)$$

wherein n is 1, 2 or 3, preferably 1 or 2;
   R is a hydrocarbyl radical having 1-12 carbon atoms;
   R' is a $C_1$-$C_6$ alkyl group;
   using at least one aqueous solution of at least one water soluble organic add catalyst,
   condensation of the so-obtained hydrolysate;
      ii. at least partially removing one or more side product of the hydrolysis reaction;
      iii. using an organic solvent to collect the condensate obtained in i.;
   b) optionally, evaporating an excess of solvent of said sol A;
   c) patterning a volume of said sol A, preferably with flexible stamps;
   d) curing the pattern of sol A issued from step c) to get at least one microfluidic gel pattern;
   e) sealing at least one face of the microfluidic gel pattern with at least an element.

2. The method according to claim 1, wherein the alkoxysilane of formula (I) is selected from the group consisting of TMOS (tetramethyl orthosilicate), TEOS (tetraethyl orthosilicate), MTEOS (methyltriethoxysilane), MTMOS (methyltrimethoxysilane), ETEOS (ethyltriethoxysilane), ETMOS (ethyltrimethoxysilane), VTEOS (vinyltriethoxysilane), VTMOS (vinyltrimethoxysilane) and mixtures thereof.

3. The method according to claim 1, wherein the organic add catalyst is chosen among carboxylic adds, preferably carboxylic adds having 1 to 12 carbon atoms and 1 to 3 carboxylic add functions, and more preferably citric acid.

4. The method according to claim 1, wherein, in step i., the molar ratio of the water to alkoxysilanes is ≥6, preferably ≥10.

5. The method according to claim 1, wherein step iii) is performed by:
   adding an organic solvent OS1 to the reaction mixture in order to produce a biphasic medium, and
   separating the aqueous phase from the organic phase containing the condensate and the organic solvent OS1.

6. The method according to claim 5, wherein after separation of the aqueous phase from the organic phase containing the condensate and the organic solvent OS1, the organic solvent OS1 is at least partially replaced by another solvent organic solvent OS2.

7. The method according to claim 1, wherein sol A has a viscosity from 0.5 mPa·s$^{-1}$ to 10 Pa·s$^{-1}$.

8. The method according to claim 1, wherein the sol A in step c) has a viscosity ≥1 Pa·s$^{-1}$, preferably between 1 and 10 Pa·s$^{-1}$.

9. The method according to claim 1, wherein step e) is done using sol A, preferably an element coated with sol A.

10. The method according to claim 9, wherein said sol A has a viscosity from 0.5 to 100 mPa·s$^{-1}$.

11. The method according to claim 1, wherein curing step d) is performed at a temperature ranging from 15° C. to 150° C., preferably from 20° C. to 120° C.

12. The method according to claim 1, wherein the depth of the patterns on the microfluidic device range from 100 nm to 1 mm, from 10 to 500 μm, or from 10 to 100 μm.

13. The method according to claim 1, wherein said method further comprises an additional step f) of surface treatment.

\* \* \* \* \*